(12) United States Patent  
Kuo

(10) Patent No.: US 7,663,881 B2  
(45) Date of Patent: Feb. 16, 2010

(54) ENCLOSURE FOR ELECTRICAL SYSTEM

(75) Inventor: Szu-Wei Kuo, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 192 days.

(21) Appl. No.: 11/834,699

(22) Filed: Aug. 7, 2007

(65) Prior Publication Data

US 2008/0112129 A1 May 15, 2008

(30) Foreign Application Priority Data

Nov. 13, 2006 (CN) .................. 2006 2 0200901 U

(51) Int. Cl.
*H05K 7/20* (2006.01)
*H05K 5/00* (2006.01)

(52) U.S. Cl. .................. 361/692; 361/679.46; 361/690; 361/693; 312/223.2; 312/236; 454/184

(58) Field of Classification Search .......... 361/687, 361/692, 693, 679.51, 690; 312/223.2, 236; 454/184

See application file for complete search history.

(56) References Cited

U.S. PATENT DOCUMENTS

| | | | | |
|---|---|---|---|---|
| 4,949,934 A * | 8/1990 | Krenz et al. | ........... | 361/679.46 |
| 5,119,270 A * | 6/1992 | Bolton et al. | .......... | 361/679.33 |
| 5,163,870 A * | 11/1992 | Cooper | ........................ | 454/184 |
| 5,297,004 A * | 3/1994 | Mazura | ....................... | 361/690 |
| 5,514,036 A * | 5/1996 | Lin | ............................ | 454/184 |
| 5,697,840 A * | 12/1997 | Bainbridge et al. | ......... | 454/184 |
| 5,820,235 A * | 10/1998 | Tsai | ....................... | 312/223.2 |
| 5,935,282 A * | 8/1999 | Lin | ............................ | 55/385.6 |
| 6,106,687 A * | 8/2000 | Edelstein | ..................... | 205/98 |
| 6,297,446 B1 * | 10/2001 | Cherniski et al. | ........... | 174/383 |
| 6,342,004 B1 * | 1/2002 | Lattimore et al. | ........... | 454/184 |
| 6,597,571 B2 * | 7/2003 | Kubota et al. | ............... | 361/695 |
| 6,680,847 B2 * | 1/2004 | Heard | ........................ | 361/692 |
| 6,735,079 B2 * | 5/2004 | Huang | ........................ | 361/695 |
| 6,767,379 B2 * | 7/2004 | Jones | ........................ | 55/385.6 |
| 6,878,902 B2 * | 4/2005 | Lyle et al. | .................... | 219/209 |
| 7,151,666 B2 * | 12/2006 | Song | .......................... | 361/692 |
| 7,323,027 B1 * | 1/2008 | Fu | .............................. | 55/385.6 |
| 7,436,665 B2 * | 10/2008 | Chen et al. | ................... | 361/695 |
| 7,499,275 B2 * | 3/2009 | Lai et al. | .................... | 361/695 |
| 7,508,663 B2 * | 3/2009 | Coglitore | .................... | 361/695 |
| 2007/0245701 A1 * | 10/2007 | Su | .............................. | 55/490 |

\* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

An enclosure for electrical system includes a side plate and an adjusting piece movably attached to the side plate. The side plate includes a heat dissipating part in which a plurality of heat dissipating holes is defined. The adjusting piece is movable with respect to the heat dissipating part for covering portions of at least some of the heat dissipating holes. The enclosure provides a function of adjusting of heat dissipation and noise suppression of an electrical system.

8 Claims, 7 Drawing Sheets

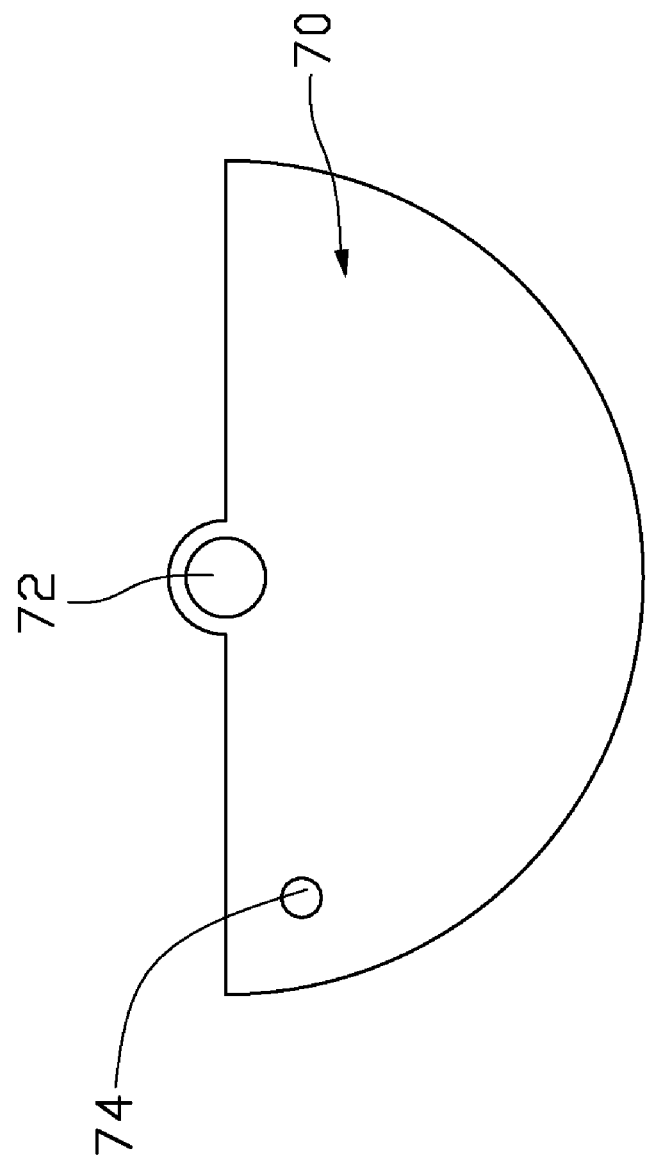

ENCLOSURE FOR ELECTRICAL SYSTEM

BACKGROUND OF THE INVENTION

1. Field of the Invention

The present invention relates to enclosures for electrical systems, and particularly to a computer case with adjustable heat dissipation and noise suppression functions.

2. Description of Related Art

In an electrical system, heat dissipation and noise suppression functions always hamper each other.

In a computer system for example, a plurality of heat dissipating holes are defined in the computer case to facilitate thermal control, an effective heat dissipating area can be increased by increasing a total number of the heat dissipating holes or a size of each heat dissipating hole, in order to enhance the heat dissipation, however, it will result in an increase of noise escaping out from the computer system; if we want to reduce the noise, the effective heat dissipating area can be reduced by reducing the total number of heat dissipating holes or the size of each heat dissipating hole, but it weakens effectiveness of the heat dissipation function. Typically, when a computer case is produced, the number and size of the heat dissipating holes are permanently fixed. It will be difficult to get an optimal balance between heat dissipation and noise suppression.

What is desired, therefore, is an enclosure for electrical system which has adjustable heat dissipation and noise suppression functions.

SUMMARY OF THE INVENTION

An exemplary enclosure for electrical system includes a side plate and an adjusting piece movably attached to the side plate. The side plate includes a heat dissipating part in which a plurality of heat dissipating holes is defined. The adjusting piece is movable with respect to the heat dissipating part for covering portions of at least some of the heat dissipating holes.

Other advantages and novel features will become more apparent from the following detailed description when taken in conjunction with the accompanying drawings, in which:

BRIEF DESCRIPTION OF THE DRAWINGS

FIG. 7 is an elevational view of the adjusting piece of FIG. 5.

DETAILED DESCRIPTION OF THE INVENTION

Figure 1:
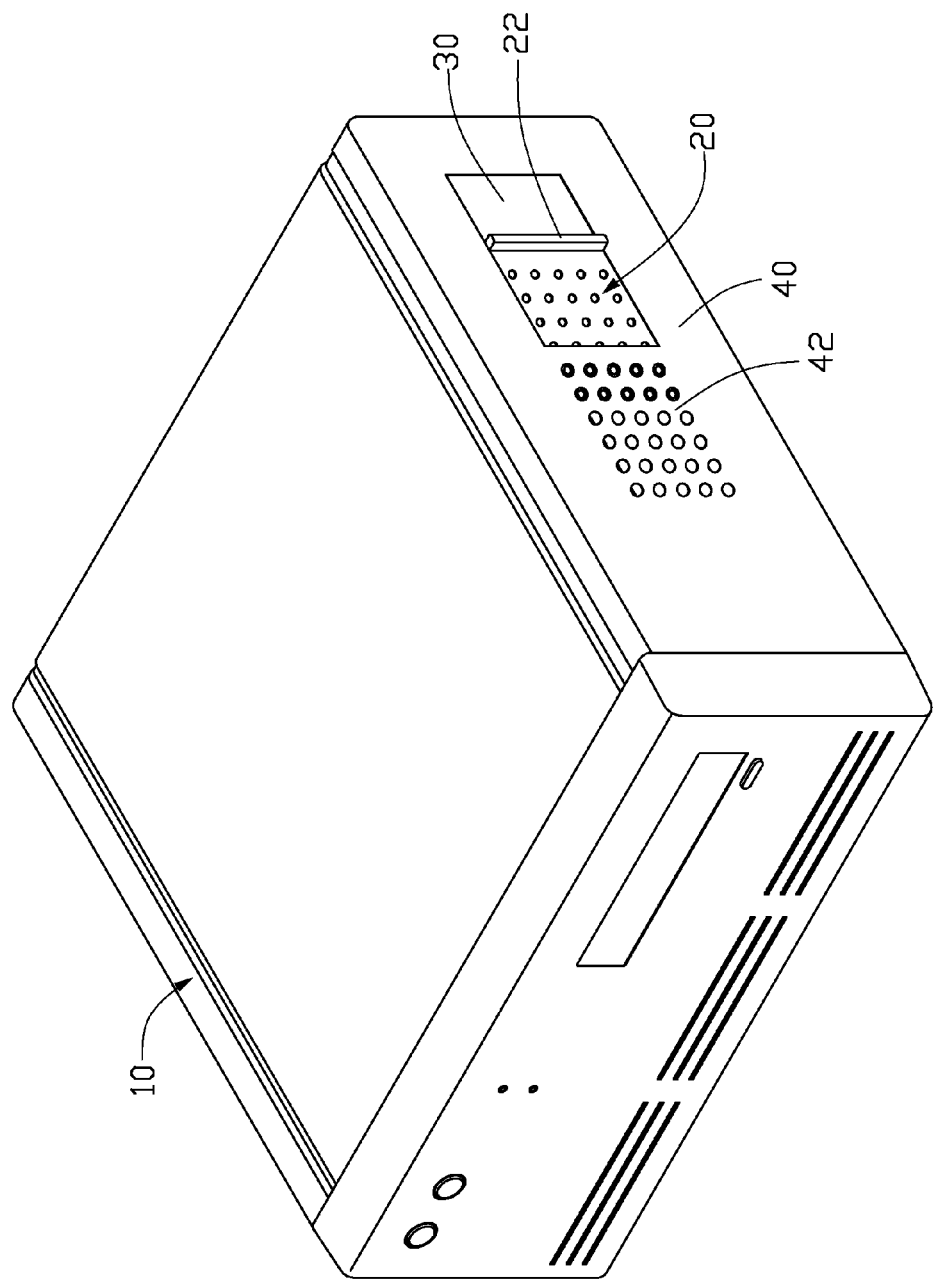
FIG. 1 is an isometric view of an enclosure in accordance with a first embodiment of the present invention, the enclosure including a top panel and a side plate.
Figure 2:
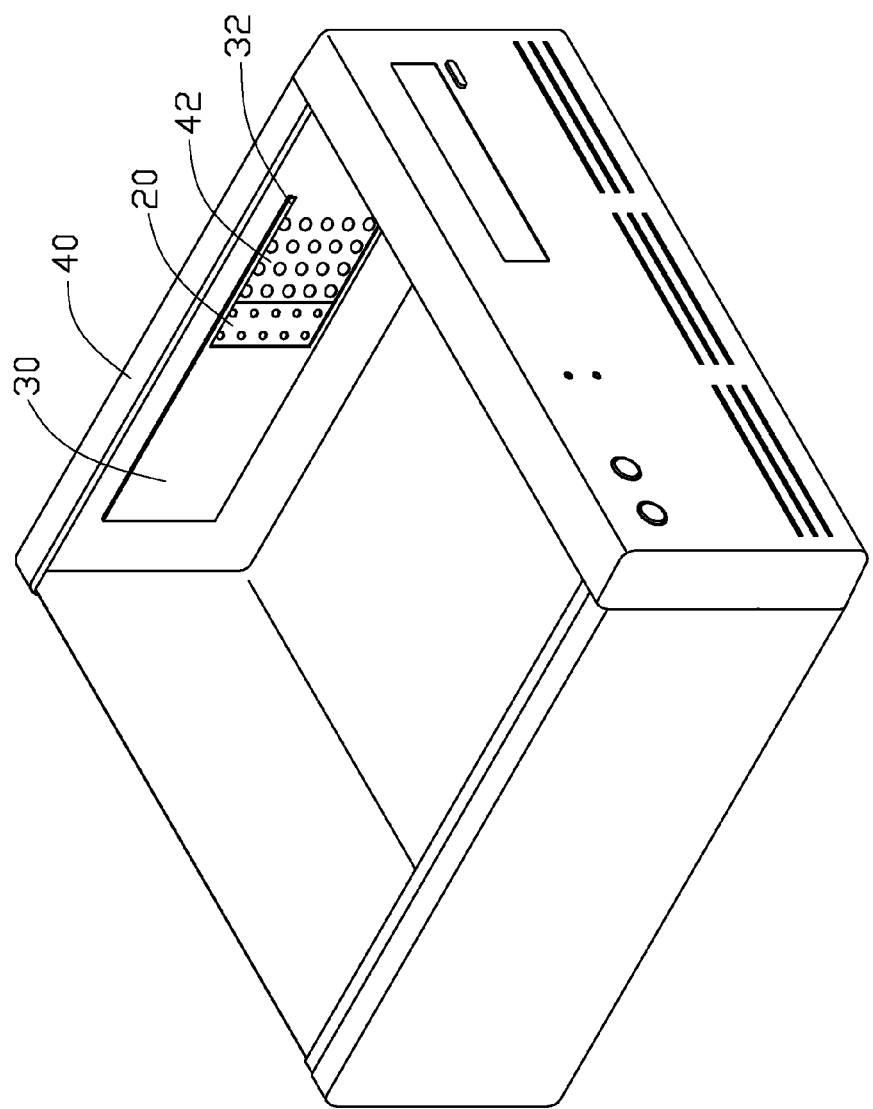
FIG. 2 is an isometric view of another viewing angle of FIG. 1 with the top plate removed therefrom.
Figure 3:
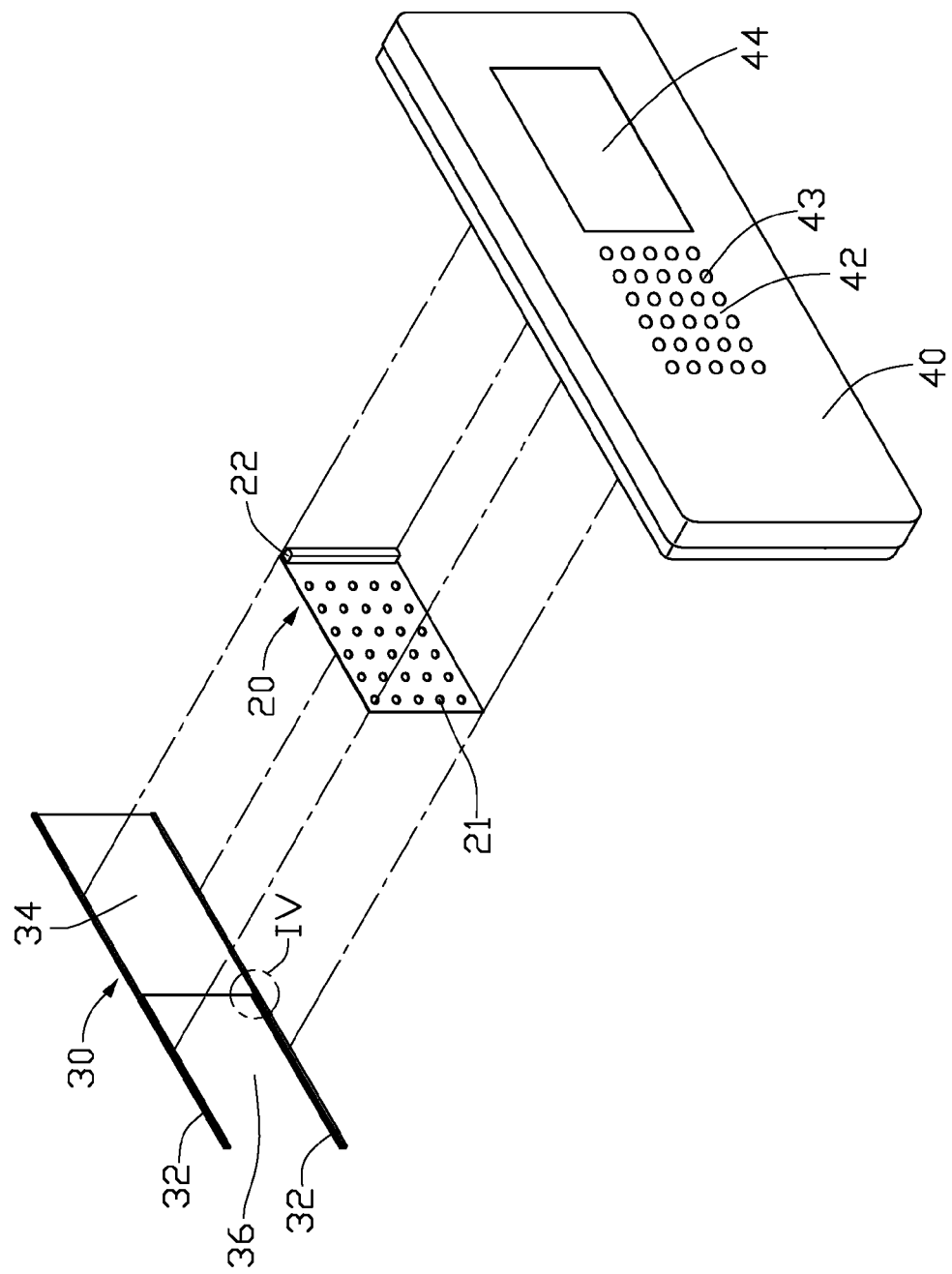
FIG. 3 is an exploded, isometric view of the side plate of FIG. 1

Referring to FIGS. 1 to 3, an enclosure for electrical system in accordance with a first embodiment of the present invention is a computer case, which includes a chassis 10, an adjusting piece 20, and a cover board 30.

The chassis 10 includes a side plate 40. The side plate 40 includes a rectangular heat dissipating part 42 in which a plurality of uniformly arrayed heat dissipating holes 43 is defined, and a rectangular opening 44 defined adjacent to the dissipating part 42.

The adjusting piece 20 has a rectangular shape, its length is equal to a length of the opening 44 of the chassis 10, and its width is a little wider than a width of the opening 44. The adjusting piece 20 includes a plurality of heat dissipating holes 21 arrayed over a portion similar in size to the dissipating part 42 and in a similar manner as the heat dissipating holes 43, except that the heat dissipating holes 21 are smaller than the heat dissipating holes 43. A handle 22 is set at an end of the adjusting piece 20. Note that the handle 22 in this embodiment is an elongate bar traversing an edge of the adjusting piece 20, but in other embodiments the handle can be other-shaped and the opening 44 adjusted to match, so long as user can operate the handle 22 to urge the adjusting piece 20 to slide back and forth to various desired positions.

The cover board 30 is a rectangular plate with longitudinal edges folded or rolled over into u-shaped channels 32, configured for sliding of the adjusting piece 20 therealong. The cover board 30 defines a cutout 36 corresponding in size to the dissipating part 42. Alternatively, the sliding channels 32 may be integrally formed on the side plate 40.

In assembly, the adjusting piece 20 is mounted on the cover board 30 with longitudinal edges thereof slidably received in the two sliding channels 32. The cover board 30 with the adjusting piece 20 is secured on the side plate 40 inside the chassis 10 by rivet joint, spot welding or other means. A solid part 34 of the cover board 30 completely covers the opening 44 of the side plate 40 when the cutout 36 corresponds to the heat dissipating part 42, and the handle 22 of the cover board 30 is exposed through the opening 44 of the side plate 40. The adjusting piece 20 is disposed between the cover board 30 and the side plate 40.

Referring again to FIG. 1, in use, the adjusting piece 20 is slid in the sliding channels 32 of the cover board 30 to a desired position by action on the handle 22. When the adjusting piece 20 is slid into the area of the cutout 36 of the cover board 30, the adjusting piece 20 can partly or completely overlap the heat dissipating holes 43 of the heat dissipating part 42 to thereby change the effective size of some or all of the heat dissipating holes 43 of the heat dissipating part 42. Thus, the user can adjust the adjusting piece 20 to change an effective heat dissipation area of the enclosure in order to get a preferred compromise between heat dissipation and noise suppression for the enclosure.

Figure 4:
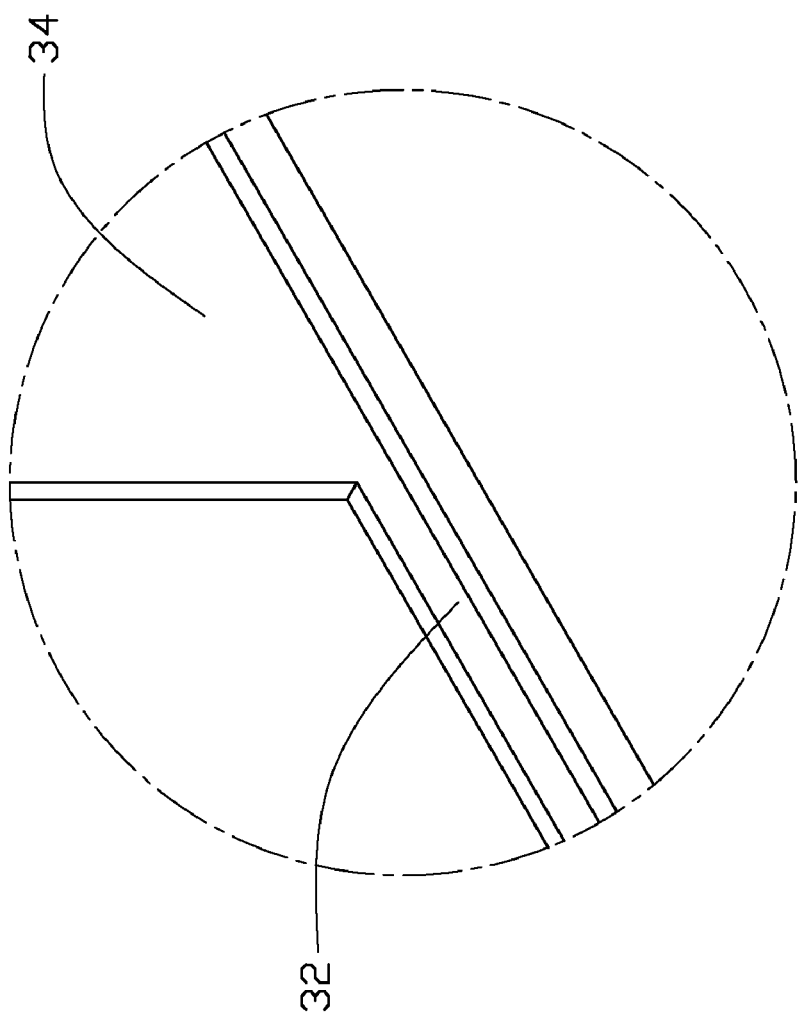
FIG. 4 is an enlarged view of circled portion IV of FIG. 3.
Figure 5:
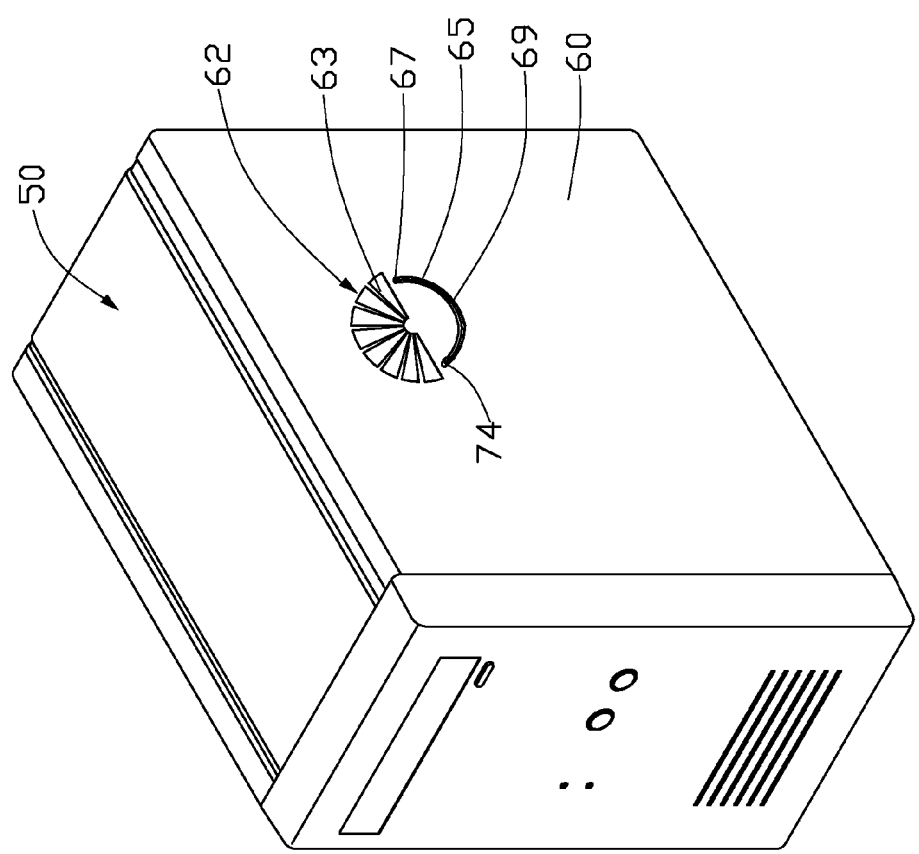
FIG. 5 is an isometric view of an enclosure in accordance with a second embodiment of the present invention, the enclosure including a top plate and an adjusting piece.
Figure 6:
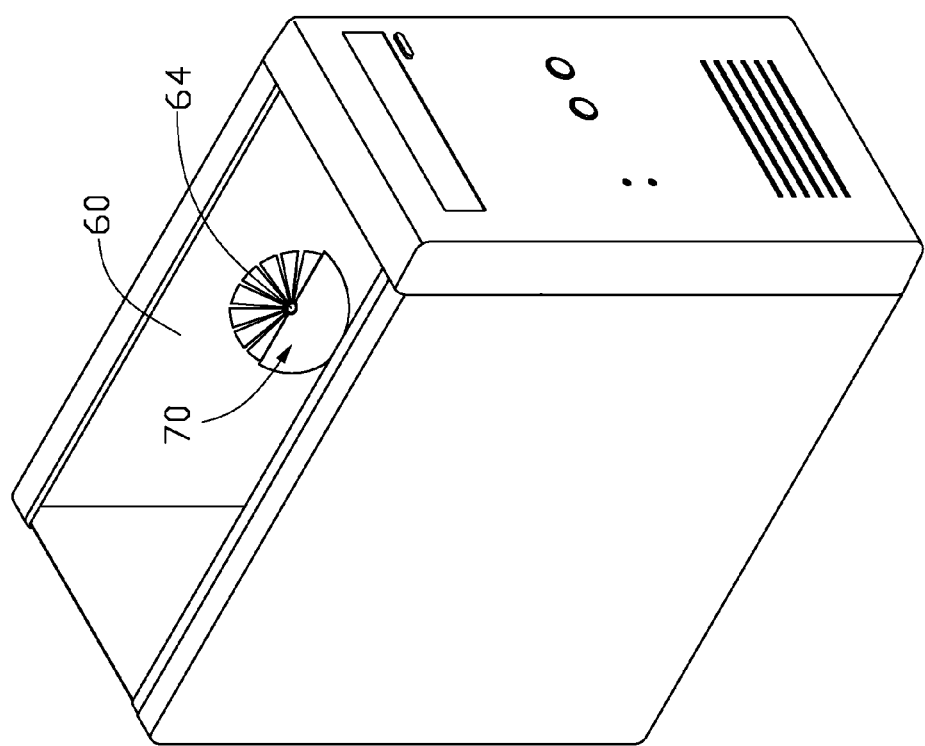
FIG. 6 is an isometric view of another viewing angle of FIG. 5 with the top plate removed therefrom.

Referring to FIGS. 4 to 6, an enclosure in accordance with a second embodiment of the present invention is a computer case, which includes a chassis 50, and an adjusting piece 70.

The chassis 50 includes a side plate 60. The side plate 60 includes a semicircular heat dissipating part 62, a pivot 64 protruding inwardly from an inner surface of the side plate 60, and an arcuate sliding slot 65 defined in the side plate 60. A plurality of uniformly arrayed heat dissipating holes 63 is radially defined in the heat dissipating part 62. The pivot 64 is set at a center of a semicircle comprised of the heat dissipating part 62 of the side plate 60. The sliding slot 65 is defined along a circumference of another semicircle whose center is also the center of the semicircle of the heat dissipating part 62. A rubber bushing 67 is received in the sliding slot 65. A slit 69 is defined in the rubber bushing 67 along the sliding slot 65.

The adjusting piece 70 is semicircular in shape. Its area is a little bigger than an area of the heat dissipating part 62 of the side plate 60. A pivot hole 72 is defined in a center of the semicircle of the adjusting piece 70. A handle 74, such as a post, protrudes from one side face on a corner of the adjusting piece 70.

In assembly, the pivot hole 72 of the adjusting piece 70 is engaged with the pivot 64 of the side plate 60. A portion of the handle 74 of the adjusting piece 70 extends through the slit 69 of the rubber bushing 67 of the sliding slot 65 and is leaved outside the side plate 60.

In use, the handle 74 of the adjusting piece 70 is manipulated to slide along the sliding slot 65 of the side plate 60 to drive the adjusting piece 70 to rotate around the pivot 64 of the side plate 60, in order to adjust the position of the adjusting piece 70. When the adjusting piece 70 moves to the area of the heat dissipating part 65 of the side plate 60, the heat dissipating holes 63 of the heat dissipating part 65 can be partly or completely covered by the adjusting piece 70. Thus, the user can adjust the adjusting piece 70 to change a total heat dissipating proportion of the chassis 50 in order to get a preferred compromise between heat dissipation efficiency and noise prevention of the enclosure. Note that a plurality of heat dissipating holes arrayed in a similar manner as the heat dissipating holes 63 of the heat dissipating part 62 of the side plate 60 may be defined in the adjusting piece 70, and the heat dissipating holes are smaller than the heat dissipating holes 63.

A layer of noise deadening foam or any other noise deadening material may be applied anywhere in the chassis as desired. It is preferred that the deadening foam is applied without shielding the dissipating holes 43 or the dissipating holes 63.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An enclosure for electrical system, comprising:
   a side plate, the side plate comprising a heat dissipating part in which a plurality of heat dissipating holes is defined, wherein a sliding groove is defined in the side plate along a circumference of a semicircle, a rubber bushing is filled in the sliding groove, a slit is defined in the rubber bushing along the sliding groove; and
   an adjusting piece pivotably attached to the side plate from inside thereof, the adjusting piece being rotatable with respect to the heat dissipating part for covering portions of at least some of the heat dissipating holes, wherein a handle is set on the adjusting piece, the handle extends through the slit of the rubber bushing and is located outside the side plate for being manipulated to drive the adjusting piece to rotate with respect to the heat dissipating part.

2. The enclosure as claimed in claim 1, wherein a pivot is set inside the side plate, and a pivot hole is defined in the adjusting piece for engaging with the pivot.

3. The enclosure as claimed in claim 1, wherein both the heat dissipating part of the side plate and the adjusting piece are semicircle-shaped, the pivot is set at the center of the semicircle of the heat dissipating part, the center of the semicircle defined by the sliding groove is also the center of the semicircle of the heat dissipating part.

4. The enclosure as claimed in claim 3, wherein the area of the adjusting piece is bigger than the area of the heat dissipating part of the side plate, the pivot hole is defined at the center of the semicircle of the adjusting piece.

5. The enclosure as claimed in claim 1, is a computer case.

6. A plate for an enclosure of an electrical device, the plate comprising:
   a part defining a plurality of first through holes; and
   an adjusting piece slidably connected to the plate, the adjusting piece being constructed to selectively shield portions of at least some of the first through holes for facilitating thermal control of the enclosure;
   wherein the adjusting piece is able to slide from a first position to a second position, wherein in the second position the adjusting piece covers all of the part defining the plurality of first through holes, and in the first position the adjusting piece does not cover any portion of the part defining the plurality of first through holes;
   wherein the adjusting piece defines a plurality of second through holes corresponding to and smaller than the first through holes of the part, the number of the second through holes of the adjusting piece equals to the number of the first through holes of the part, the second through holes of the adjusting piece are arrayed in a same manner as the first through holes of the part such that when the adjusting piece is moved to the second position, the second through holes of the adjusting piece are aligned with the corresponding first through holes of the part;
   wherein the adjusting piece is mounted inside the plate;
   wherein a handle is set on the adjusting piece, a void is defined in the plate corresponding to the handle, the handle extends through the void and is located outside the plate for being manipulated to drive the adjusting piece to move with respect to the part;
   wherein a cover board is fixed to an inner surface of the plate and covers the void, the cover board comprises two sliding channels, and a cutout aligned with the heat dissipating part, the adjusting piece is located between the cover board and the plate with two opposite edges thereof slidably received in the sliding channels respectively.

7. The plate as claimed in claim 6, wherein two sliding channels are formed on the plate, and two opposite edges of the adjusting piece are slidably received in the sliding channels.

8. The plate as claimed in claim 6, wherein both the heat dissipating part of the plate and the adjusting piece are rectangular-shaped, and the adjusting piece is bigger than the heat dissipating part.

* * * * *